United States Patent
Chow et al.

(10) Patent No.: US 7,732,252 B2
(45) Date of Patent: Jun. 8, 2010

(54) MULTI-CHIP PACKAGE SYSTEM INCORPORATING AN INTERNAL STACKING MODULE WITH SUPPORT PROTRUSIONS

(75) Inventors: Seng Guan Chow, Singapore (SG); Heap Hoe Kuan, Singapore (SG); Rui Huang, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/248,878

(22) Filed: Oct. 9, 2008

(65) Prior Publication Data

US 2010/0090350 A1    Apr. 15, 2010

(51) Int. Cl.
*H01L 21/44* (2006.01)
*H01L 23/02* (2006.01)

(52) U.S. Cl. .................. 438/107; 438/124; 438/127; 257/685; 257/723

(58) Field of Classification Search .......... 438/107, 438/108, 109, 124–127; 257/685, 686, 687, 257/723, 724, 725
See application file for complete search history.

(56) References Cited

U.S. PATENT DOCUMENTS

| | | | |
|---|---|---|---|
| 5,783,426 A * | 7/1998 | Suzuki et al. | 436/115 |
| 6,861,288 B2 * | 3/2005 | Shim et al. | 438/109 |
| 6,946,323 B1 * | 9/2005 | Heo | 438/109 |
| 7,288,835 B2 * | 10/2007 | Yim et al. | 257/685 |
| 7,550,832 B2 * | 6/2009 | Weng et al. | 257/685 |
| 2006/0006518 A1 * | 1/2006 | Bolken et al. | 257/686 |
| 2007/0181990 A1 * | 8/2007 | Huang et al. | 257/686 |
| 2008/0006925 A1 | 1/2008 | Yim et al. | |
| 2008/0054451 A1 | 3/2008 | Bauer et al. | |
| 2008/0233684 A1 * | 9/2008 | Chee Peng et al. | 438/123 |

\* cited by examiner

*Primary Examiner*—Kevin M Picardat
(74) *Attorney, Agent, or Firm*—Mikio Ishimaru

(57) ABSTRACT

The present invention provides a multi-chip package system that includes: providing a package substrate; attaching a base semiconductor die to the package substrate; connecting an interconnect between the base semiconductor die and the package substrate; and encapsulating at least portions of the package substrate, the base semiconductor die, and the interconnect with an encapsulant defining a support protrusion adjacent to the interconnect and substantially perpendicular to the package substrate, a cavity bounded by the support protrusion, and a gap linking the cavity to the edge of the encapsulant.

20 Claims, 7 Drawing Sheets

MULTI-CHIP PACKAGE SYSTEM INCORPORATING AN INTERNAL STACKING MODULE WITH SUPPORT PROTRUSIONS

TECHNICAL FIELD

The present invention relates generally to semiconductor packaging technology, and more particularly to a multi-chip package system incorporating an internal stacking module with support protrusions.

BACKGROUND ART

As new generations of electrical consumer products are developed, there is a growing need for miniaturization of components, integration of several system functions within a component, and improvement of component performance and reliability. For example, thin semiconductor packages have enabled the implementation of consumer products with lower profiles such as ultra-thin cell phones, displays, and laptop computers. Similarly, integration of electronic components within a single package has increased the performance cell phones and computers.

Advances in semiconductor package technology continue to enable miniaturization, greater system integration, and greater reliability while reducing the overall cost of consumer devices. These trends have resulted in a requirement for increased circuit density and have led to the development of multi-chip packages incorporating more than one semiconductor die.

A single-chip package provides mechanical support for an individual semiconductor die and one or more layers of interconnect lines that enable the integrated circuits to be connected electrically to surrounding circuitry within separate semiconductor dies.

Current multi-chip packages, also commonly referred to as multi-chip modules, typically consist of a PCB substrate onto which a set of separate semiconductor dies is directly attached. The reliable implementation of multi-chip packages may be impacted when several semiconductor dies are arranged vertically or horizontally in the package because one critical defect induces a complete package failure, which is costly.

Moreover, vertically stacked semiconductor dies in typical multi-chip packages can present problems beyond those of horizontally arranged integrated circuit packages, further complicating the manufacturing process. It is more difficult to test and thus determine the actual failure mode of the individual semiconductor die. Moreover individual semiconductor dies are often damaged during assembly or testing, complicating the manufacturing process and increasing costs, since a single semiconductor die or interconnect defect results in the failure of the entire multi-chip package.

Thus, a need still remains for a means for creating multi-chip package systems incorporating several semiconductor dies that can be assembled using pre-tested modules, also known as Known Good Packages (KGP). Moreover, these package modules must also have a robust design and construction to withstand stresses and temperature cycles used for the assembly of the multi-chip package.

In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a multi-chip package system that includes: providing a package substrate; attaching a base semiconductor die to the package substrate; connecting an interconnect between the base semiconductor die and the package substrate; and encapsulating at least portions of the package substrate, the base semiconductor die, and the interconnect with an encapsulant defining a support protrusion adjacent to the interconnect and substantially perpendicular to the package substrate, a cavity bounded by the support protrusion, and a gap linking the cavity to the edge of the encapsulant.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
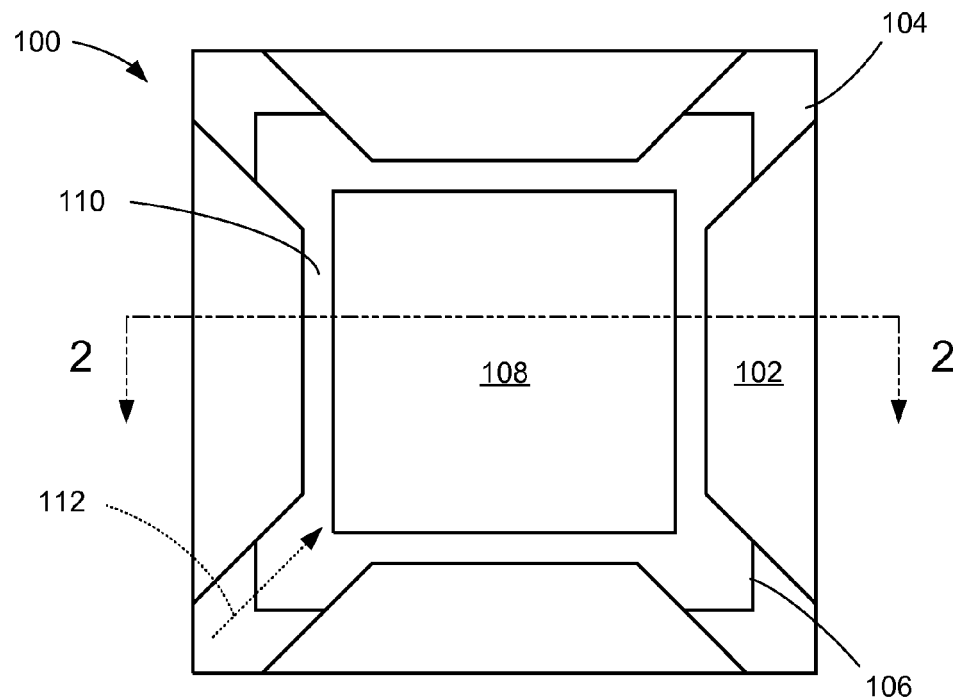
FIG. 1 is a top plan view of an internal stacking module with a support protrusion.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

In addition, where multiple embodiments are disclosed and described having some features in common, for clarity and ease of illustration, description, and comprehension thereof, similar and like features one to another will ordinarily be described with the same reference numerals.

For expository purposes, the term "horizontal" as used herein is defined as a plane parallel to the plane or surface of the package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements. The term "processing" as used herein includes deposition of material or photoresist, patterning, exposure, development, etching, cleaning, and/or removal of the material or photoresist as required in forming a described structure.

The term "system" as used herein refers to and is defined as the method and as the apparatus of the present invention in accordance with the context in which the term is used.

Referring now to FIG. 1, therein is shown a top plan view of an internal stacking module 100 with a support protrusion 102. The internal stacking module 100 incorporates a package substrate 104, a base semiconductor die 106, and a flip-chip semiconductor die 108. The support protrusion 102 is shaped to form a cavity 110 and a gap 112, the latter providing access for the flow of an encapsulant (not shown) to central portions of the internal stacking module 100 during integration of the internal stacking module 100 into a larger multi-chip package.

In the preferred embodiment of the present invention the internal stacking module 100 is tested and classified as a Known Good Package (KGP) before integration into a larger multi-chip package.

Figure 2:
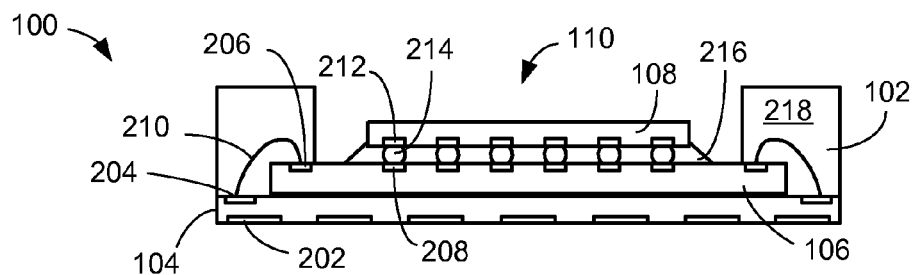
FIG. 2 is a cross-sectional of the internal stacking module taken along line 2-2 in FIG. 1.

Referring now to FIG. 2, therein is shown a cross-sectional of the internal stacking module 100 taken along line 2-2 in FIG. 1. The internal stacking module 100 supports the base semiconductor die 106 mounted on the package substrate 104, and the flip-chip semiconductor die 108 mounted on top of the base semiconductor die 106. The package substrate 104 provides an interface for connecting the internal stacking module 100 to a larger package system.

The package substrate 104 includes a bottom contact pad 202 on its lower surface as well as a top contact pad 204 on its upper surface. The bottom contact pad 202 and the top contact pad 204 are connected to conductive surface traces (not shown) arranged on the bottom surface and the top surface of the package substrate 104. Through vias or blind vias (not shown) may directly or indirectly connect the bottom contact pad 202 to the top contact pad 204.

A wire contact pad 206 and a die contact pad 208 provide electrical access to electronic, optoelectronic, electromechanical or any other element that use electrical power or signals in the base semiconductor die 106. An interconnect 210, such as a bond wire, connects the wire contact pad 206 in the base semiconductor die 106 to the top contact pad 204 in the package substrate 104, providing an electrical connection between the two elements.

Similarly, a flip-chip contact pad 212 provides electrical access to electronic, optoelectronic, electromechanical or any other element that use electrical power or signals in the flip-chip semiconductor die 108. An interconnect 214, such as a solder bump or solder ball, connects the flip-chip contact pad 212 in the flip-chip semiconductor die 108 to the die contact pad 208 in the base semiconductor die 106. An underfill material 216 covers the interconnect 214 and at least portions of the base semiconductor die 106 and the flip-chip semiconductor die 108.

The support protrusion 102 is an element formed by an encapsulant 218, such as a molding compound, encapsulating at least portions of the interconnect 210, the package substrate 104, and the base semiconductor die 106. The support protrusion 102 is designed to project above the base semiconductor die 106, defining the cavity 110 and the gap 112 of FIG. 1. The sidewalls of the support protrusion 102 are substantially perpendicular in the top surface of the package substrate 104.

Figure 3:
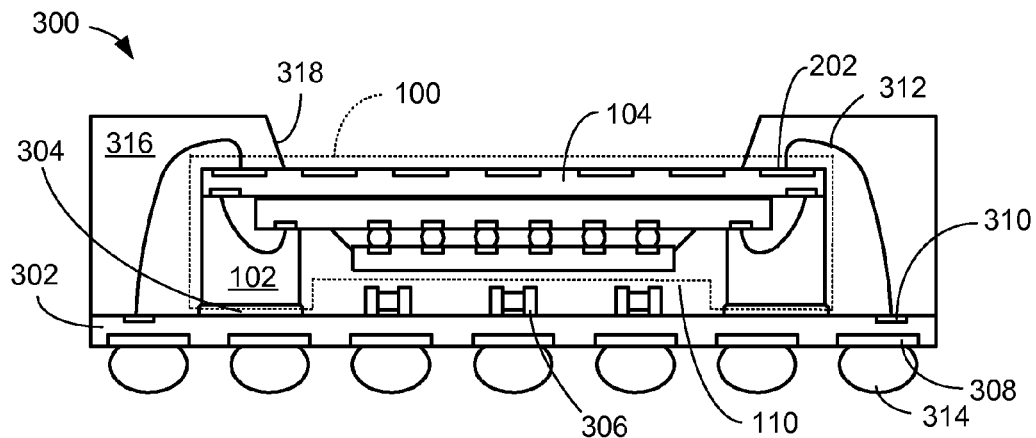
FIG. 3 is a cross-sectional of a multi-chip package system incorporating the internal stacking module shown in FIG. 2.

Referring now to FIG. 3, therein is shown a cross-sectional of a multi-chip package system 300 incorporating the internal stacking module 100 shown in FIG. 2. The multi-chip package system 300 is implemented by mounting the internal stacking module 100 upside-down over a base package substrate 302. In the preferred embodiment of the invention, the internal stacking module 100 is pre-tested and classified as a Known Good Package (KGP). In this embodiment of the invention, the internal stacking module 100 may be attached to the base package substrate 302 using an adhesive 304 among several other options.

The base package substrate 302 supports a device 306 such a passive component or a semiconductor die and includes a bottom contact pad 308 on its lower surface and a top contact pad 310 on its upper surface. The bottom contact pad 308 and the top contact pad 310 are connected to conductive surface traces (not shown) arranged on the bottom surface and the top surface of the base package substrate 302. Through vias or blind vias (not shown) may directly or indirectly connect the bottom contact pad 308 to the top contact pad 310.

An interconnect 312, such as a bond wire, connects the bottom contact pad 202 in the package substrate 104 to the top contact pad 310 in the base package substrate 302. It has been discovered that the support protrusion 102 in the internal stacking module 100 provides support that reduces or eliminates deflection of the package substrate 104 during the formation of the interconnect 312, increasing the fabrication robustness and overall reliability of the multi-chip package system 300.

The bottom contact pad 308 in the base package substrate 302 is employed as an electrical connection point to the multi-chip package system 300. The bottom contact pad 308 primarily supports connections to the next package level through an external interconnect 314 such as a solder bump and solder ball.

An encapsulant 316, such as a molding compound, covers at least portions of the base package substrate 302, the internal stacking module 100, the interconnect 312, and the device 306. The encapsulant 316 has a sidewall 318 that may be tapered as shown in FIG. 3, or perpendicular from the top surface of the package substrate 104 in the internal stacking module 100. The configuration of the support protrusion 102 as shown in FIG. 1 enables flow of the encapsulant 316 into the central region of the cavity 110 shown in FIG. 3 during the formation process for the encapsulant 316.

Figure 4:
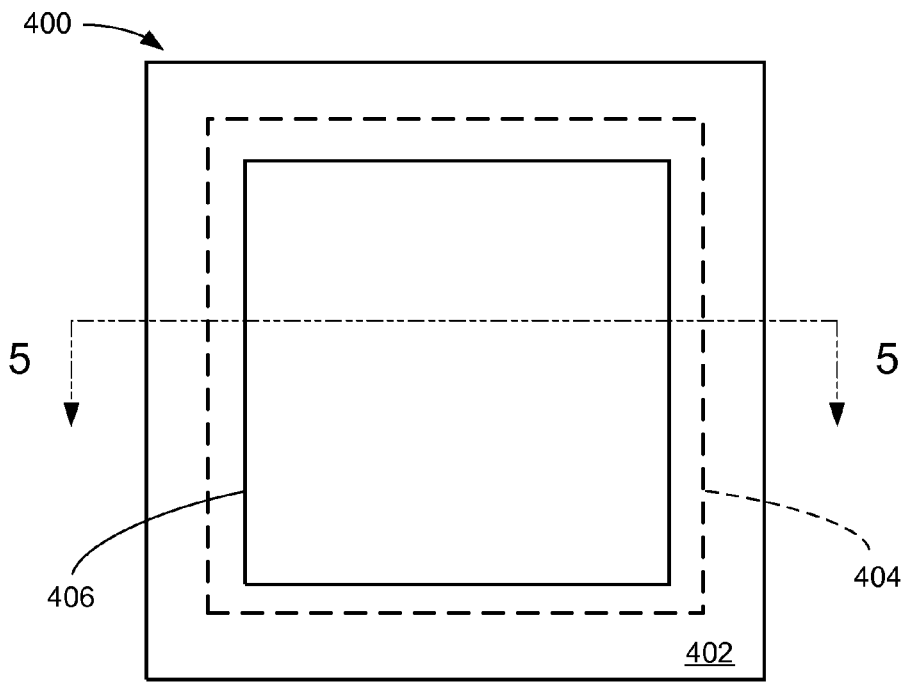
FIG. 4 is a top plan view of a second embodiment of an internal stacking module with a support protrusion.

Referring now to FIG. 4, therein is shown a top plan view of a second embodiment of an internal stacking module 400 with a support protrusion 402. The support protrusion 402 covers at least portions of a base semiconductor die 404. The center region of the internal stacking module 400 is not covered by the support protrusion 402, effectively forming a cavity 406.

In the preferred embodiment of the present invention the internal stacking module 400 is tested and classified as a Known Good Package (KGP) before integration into a larger multi-chip package.

Figure 5:
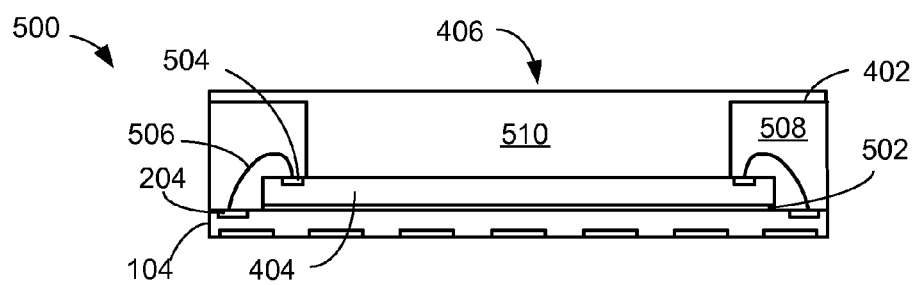
FIG. 5 is a cross-sectional of the internal stacking module taken along line 5-5 in FIG. 4.

Referring now to FIG. 5, therein is shown a cross-sectional of the internal stacking module 400 taken along line 5-5 in FIG. 4. The internal stacking module 400 supports the base semiconductor die 404 mounted over the package substrate 104 using an adhesive 502.

A wire contact pad 504 provides electrical access to electronic, optoelectronic, electromechanical or any other element that use electrical power or signals in the base semiconductor die 404. An interconnect 506, such as a bond wire, connects the wire contact pad 504 in the base semiconductor die 404 to the top contact pad 204 in the package substrate 104, providing an electrical connection between the two elements.

The support protrusion 402 is an element formed by an encapsulant 508, such as a molding compound, encapsulating at least portions of the interconnect 506, the package substrate 104, and the base semiconductor die 404. The support protrusion 402 is designed to project above the base semiconductor die 404, defining the cavity 406. The sidewalls of the support protrusion 402 are substantially perpendicular in the top surface of the package substrate 104.

The cavity 406 in the internal stacking module 400 is pre-filled with a penetrable adhesive material 510 prior to integration into a larger package system. The term "penetrable adhesive material" as used herein is defined as an encapsulation material that can be applied in a soft state and which can be cured to a rigid state. A penetrable material is generally used to prevent bond wire movement, also known as "wire sweep," during the application of the encapsulant.

Figure 6:
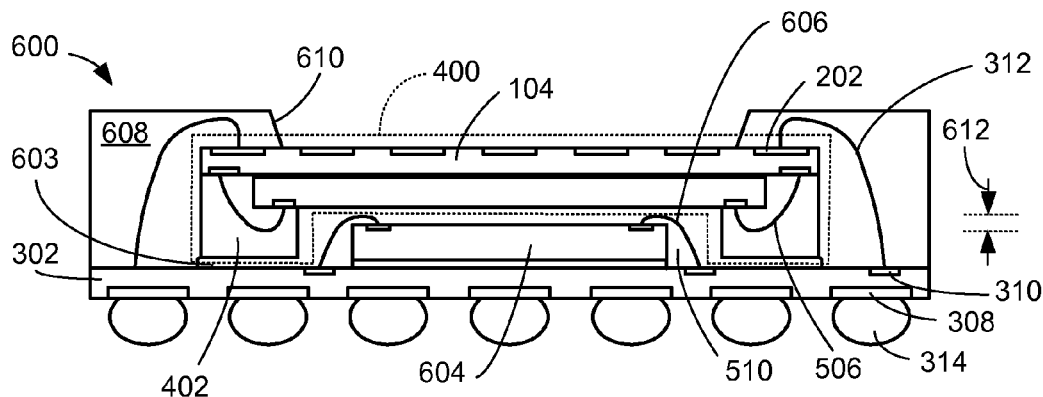
FIG. 6 is a cross-sectional of a multi-chip package system incorporating the internal stacking module shown in FIG. 5.

Referring now to FIG. 6, therein is shown a cross-sectional of a multi-chip package system 600 incorporating the internal stacking module 400 shown in FIG. 5. The multi-chip package system 600 is implemented by mounting the internal stacking module 400 upside-down over the base package substrate 302. In this embodiment of the invention, the internal stacking module 400 is attached to the base package substrate 302 using a penetrable adhesive material 510.

In the attachment process joining the support protrusion 402 in the internal stacking module 400 to the base package substrate 302, excess filling of the cavity 406 shown in FIG. 5 with the penetrable adhesive material 510 defines a vertical separation 603 between the support protrusion 402 and the base package substrate 302.

The base package substrate 302 supports a device 604 such a passive component or a semiconductor die and includes the bottom contact pad 308 on its lower surface and the top contact pad 310 on its upper surface. The device 604 may be connected to the base package substrate 302 using an interconnect 606 such as a bond wire.

The interconnect 312 connects the bottom contact pad 202 in the package substrate 104 to the top contact pad 310 in the base package substrate 302. It has been discovered that the support protrusion 402 in the internal stacking module 400 provides support that reduces or eliminates deflection of the package substrate 104 during the formation of the interconnect 312, increasing the fabrication robustness and overall reliability of the multi-chip package system 600.

The bottom contact pad 308 in the base package substrate 302 is employed as an electrical connection point to the multi-chip package system 600. The bottom contact pad 308 primarily supports connections to the next package level through the external interconnect 314 such as a solder bump and solder ball.

An encapsulant 608, such as a molding compound, covers at least portions of the base package substrate 302, the internal stacking module 400, and the interconnect 312. The encapsulant 608 has a sidewall 610 that may be tapered as shown in FIG. 6, or perpendicular from the top surface of the package substrate 104 in the internal stacking module 400.

It has been discovered that the multi-chip package system 600 results in a thinner total package thickness. A thickness reduction distance 612 results from the vertical overlap between the wire loop in the interconnect 606, and the wire loop in the interconnect 210 in the internal stacking module 400.

Figure 7:
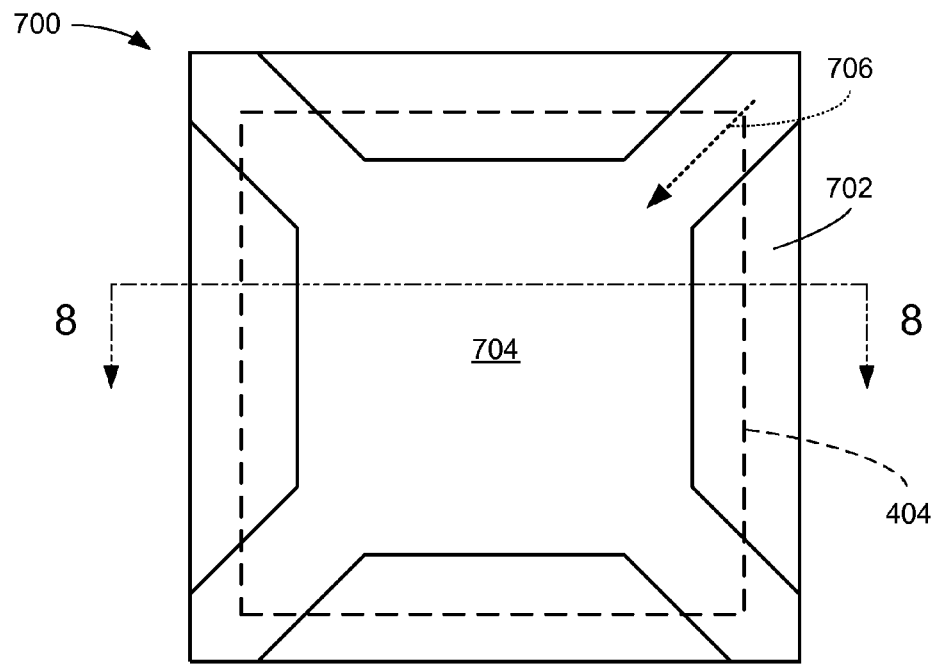
FIG. 7 is a top plan view of a third embodiment of an internal stacking module with a support protrusion.

Referring now to FIG. 7, therein is shown a top plan view of a third embodiment of an internal stacking module 700 with a support protrusion 702. The support protrusion 702 covers at least portions of the base semiconductor die 404. The center region of the internal stacking module 700 includes a cavity 704 and a gap 706, the latter providing access for the flow of an encapsulant during integration of the internal stacking module 700 into a larger multi-chip package.

In the preferred embodiment of the present invention the internal stacking module 700 is tested and classified as a Known Good Package (KGP) before integration into a larger multi-chip package.

Figure 8:
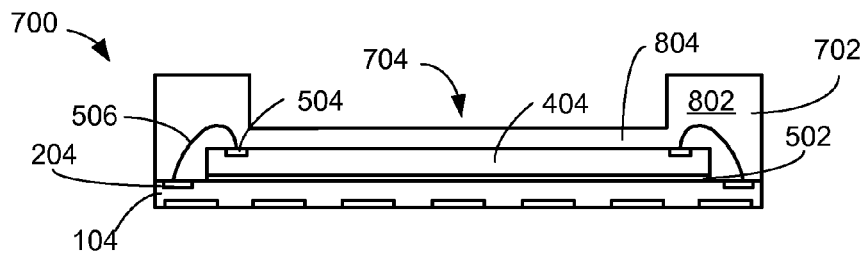
FIG. 8 is a cross-sectional of the internal stacking module taken along line 8-8 in FIG. 7.

Referring now to FIG. 8, therein is shown a cross-sectional of the internal stacking module 700 taken along line 8-8 in FIG. 7. The internal stacking module 700 supports the base semiconductor die 404 mounted over the package substrate 104 using the adhesive 502.

The wire contact pad 504 provides electrical access to electronic, optoelectronic, electromechanical or any other element that use electrical power or signals in the base semiconductor die 404. The interconnect 506 connects the wire contact pad 504 in the base semiconductor die 404 to the top contact pad 204 in the package substrate 104, providing an electrical connection between the two elements.

The support protrusion 702 is an element formed by an encapsulant 802, such as a molding compound, encapsulating at least portions of the interconnect 506, the package substrate 104, and the base semiconductor die 404. The support protrusion 702 is designed to project above the base semiconductor die 404, defining the cavity 704 and the gap 706. The sidewalls of the support protrusion 702 are substantially perpendicular in the top surface of the package substrate 104. In this embodiment of the invention, the encapsulant 802 also forms an encapsulation layer 804 above portions of the base semiconductor die 404.

Figure 9:
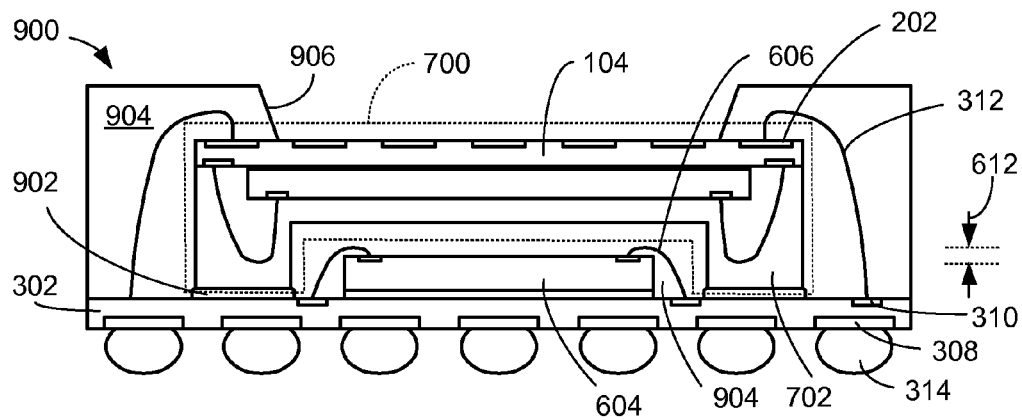
FIG. 9 is a cross-sectional of a multi-chip package system incorporating the internal stacking module shown in FIG. 8.

Referring now to FIG. 9, therein is shown a cross-sectional of a multi-chip package system 900 incorporating the internal stacking module 700 shown in FIG. 8. The multi-chip package system 900 is implemented by mounting the internal stacking module 700 upside-down over the base package substrate 302.

The internal stacking module 700 is attached to the base package substrate 302 using an adhesive 902. The base package substrate 302 supports the device 604 such a passive component or a semiconductor die and includes the bottom contact pad 308 on its lower surface and the top contact pad 310 on its upper surface. The device 604 may be connected to the base package substrate 302 using the interconnect 606.

The interconnect 312 connects the bottom contact pad 202 in the package substrate 104 to the top contact pad 310 in the base package substrate 302. It has been discovered that the support protrusion 702 in the internal stacking module 700 provides support that reduces or eliminates deflection of the package substrate 104 during the formation of the interconnect 312, increasing the fabrication robustness and overall reliability of the multi-chip package system 900.

The bottom contact pad 308 in the base package substrate 302 is employed as an electrical connection point to the multi-chip package system 900. The bottom contact pad 308 primarily supports connections to the next package level through the external interconnect 314 such as a solder bump and solder ball.

An encapsulant 904, such as a molding compound, covers at least portions of the base package substrate 302, the internal stacking module 700, the interconnect 312, and the device 604. The encapsulant 904 has a sidewall 906 that may be tapered as shown in FIG. 9, or perpendicular from the top surface of the package substrate 104 in the internal stacking module 700. The configuration of the support protrusion 702 as shown in FIG. 7 enables flow of the encapsulant 904 into the cavity 704 shown in FIG. 8 through the gap 706 shown in FIG. 7 during the formation process for the encapsulant 904.

It has been discovered that the multi-chip package system 900 results in a thinner total package thickness. A thickness reduction distance 612 results from the vertical overlap between the wire loop in the interconnect 606 and the wire loop in the interconnect 210 in the internal stacking module 400.

Figure 10:
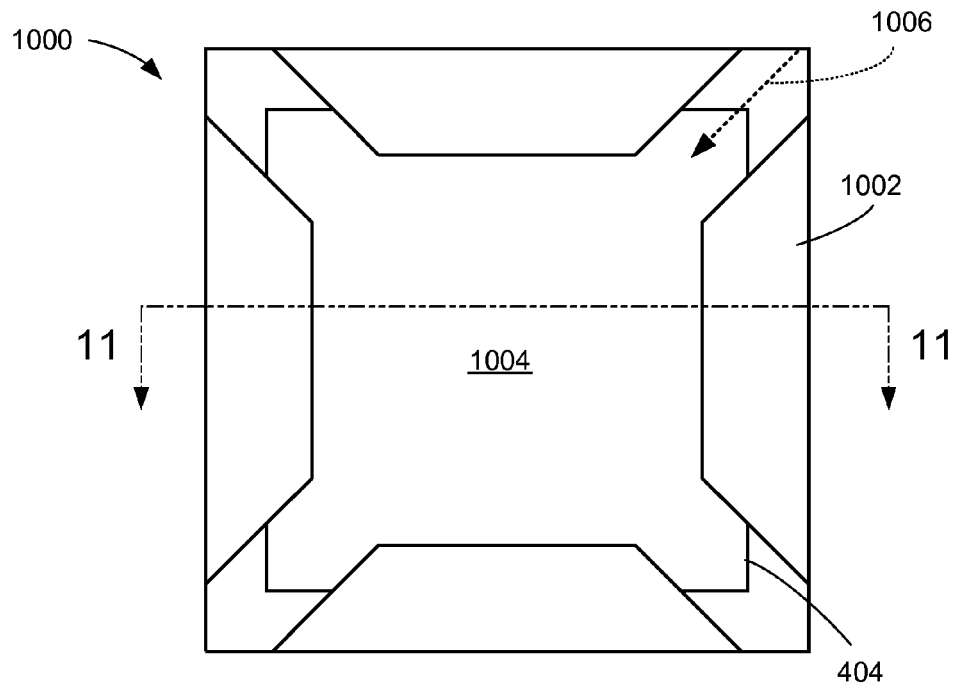
FIG. 10 is a top plan view of a fourth embodiment of the internal stacking module shown in FIG. 8.

Referring now to FIG. 10, therein is shown a top plan view of a fourth embodiment of an internal stacking module 1000 with a support protrusion 1002. The support protrusion 1002 covers at least portions of the base semiconductor die 404 and is shaped to form a cavity 1004 and a gap 1006, the latter providing access for the flow of an encapsulant (not shown) to central portions of the internal stacking module 1000 during integration of the internal stacking module 1000 into a larger multi-chip package.

In the preferred embodiment of the present invention the internal stacking module 1000 is tested and classified as a Known Good Package (KGP) before integration into a larger multi-chip package.

Figure 11:
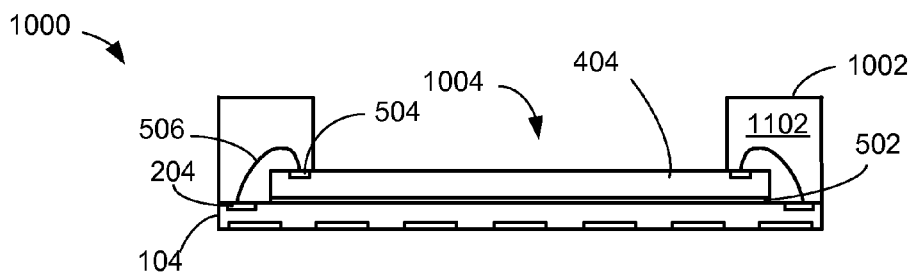
FIG. 11 is a cross-sectional of the internal stacking module taken along line 11-11 in FIG. 10.

Referring now to FIG. 11, therein is shown a cross-sectional of the internal stacking module 1000 taken along line 11-11 in FIG. 10. The internal stacking module 1000 supports the base semiconductor die 404 mounted over the package substrate 104 using the adhesive 502.

The wire contact pad 504 provides electrical access to electronic, optoelectronic, electromechanical or any other element that use electrical power or signals in the base semiconductor die 404. The interconnect 506 connects the wire contact pad 504 in the base semiconductor die 404 to the top contact pad 204 in the package substrate 104, providing an electrical connection between the two elements.

The support protrusion 1002 is an element formed by an encapsulant 1102, such as a molding compound, encapsulating at least portions of the interconnect 506, the package substrate 104, and the base semiconductor die 404. The support protrusion 702 is designed to project above the base semiconductor die 404, defining the cavity 1004 and the gap 1006. The sidewalls of the support protrusion 1002 are substantially perpendicular in the top surface of the package substrate 104.

Figure 12:
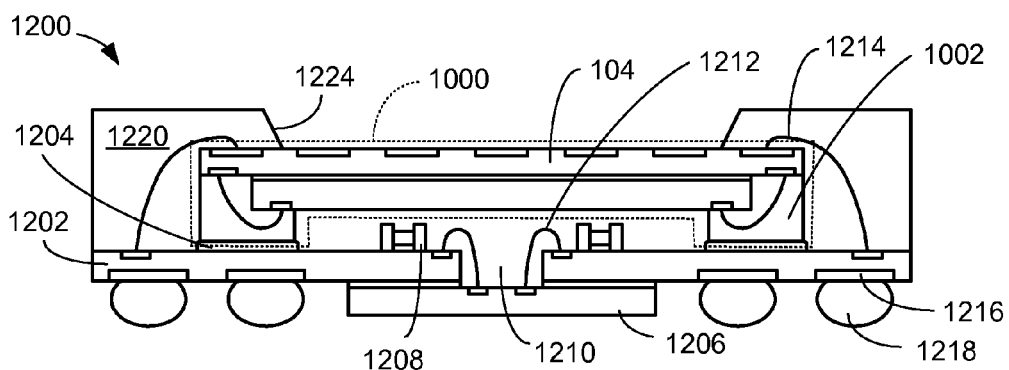
FIG. 12 is a cross-sectional of a multi-chip package system incorporating the internal stacking module shown in FIG. 11.

Referring now to FIG. 12, therein is shown a cross-sectional of a multi-chip package system 1200 incorporating the internal stacking module 1000 shown in FIG. 11. The multi-chip package system 1200 is implemented by mounting the internal stacking module 1000 upside-down over a base package substrate 1202 using an adhesive 1204.

The base package substrate 1202 supports a below-substrate semiconductor die 1206 and a device 1208 such a passive component or a semiconductor die. An opening 1210 in the base package substrate 1202 enables connecting the below-substrate semiconductor die 1206 to the top surface of the base package substrate 1202 using an interconnect 1212 such as a bond wire.

An interconnect 1214, such as a bond wire, connects the package substrate 104 in the internal stacking module 1000 to the base package substrate 1202. It has been discovered that the support protrusion 1002 in the internal stacking module 1000 provides support that reduces or eliminates deflection of the package substrate 104 during the formation of the interconnect 1214, increasing the fabrication robustness and overall reliability of the multi-chip package system 1200.

A bottom contact pad 1216 in the base package substrate 1202 is employed as an electrical connection point to the multi-chip package system 1200. The bottom contact pad 1216 primarily supports connections to the next package level through an external interconnect 1218 such as a solder bump and solder ball.

An encapsulant 1220, such as a molding compound, covers at least portions of the base package substrate 1202, the internal stacking module 1000, the interconnect 1212, the interconnect 1214, the below-substrate semiconductor die 1206, and the device 1208. The encapsulant 1220 has a sidewall 1224 that may be tapered as shown in FIG. 12, or perpendicular from the top surface of the package substrate 104 in the internal stacking module 1000. The configuration of the support protrusion 1002 as shown in FIG. 10 enables flow of the encapsulant 1220 into the cavity 1004 shown in FIG. 11 through the gap 1006 shown in FIG. 10 during the formation process for the encapsulant 1220.

Figure 13:
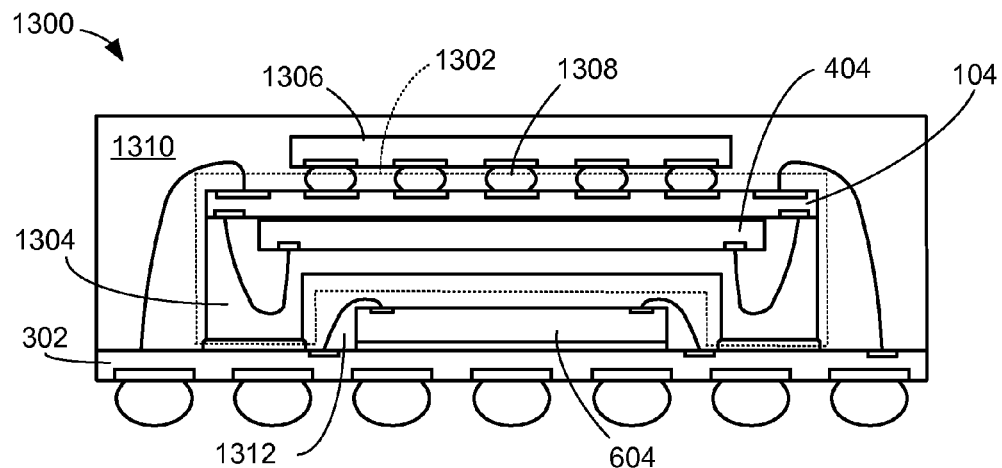
FIG. 13 is a cross-sectional view of a multi-chip package system incorporating an internal stacking module with a similar cross-sectional shape as the internal stacking module shown in FIG. 8.

Referring now to FIG. 13, therein is shown a cross-sectional view of a multi-chip package system 1300 incorporating an internal stacking module 1302 with a similar cross-sectional shape as the internal stacking module 700 shown in FIG. 8. The internal stacking module 1302 includes a support protrusion 1304 with the top plan view design shown in FIG. 4. The multi-chip package system 1300 is a representative example of how the invention may be employed in a sensing application.

The configuration of the multi-chip package system 1300 is very similar to the configuration of the multi-chip package system 900 shown in FIG. 9, with the exception that the top view design for the support protrusion 1304 corresponds to the one shown in FIG. 4 and the inclusion of a top flip-chip semiconductor die 1306 mounted over the package substrate 104 using an interconnect 1308. An encapsulant 1310 covers at least portions of the internal stacking module 1302, the top flip-chip semiconductor die 1306, and at the base package substrate 302.

The application for the multi-chip package system 1300 shown in FIG. 13 is an integrated sensor incorporating a sensing element such as a Micro-Electro Mechanical Sensor (MEMS), a micro-controller, and on-board memory. In this embodiment of the invention, the device 604 is the sensor, the base semiconductor die 404 is the microcontroller, and the top flip-chip semiconductor die 1306 is a volatile or a non-volatile memory device. In one embodiment of the invention the top flip-chip semiconductor die 1306 is replaced with a stack of semiconductor dies.

In one embodiment of the invention the internal stacking module 1302 includes a cavity 1312 that can be hermetically sealed from the environment external to the multi-chip package system 1300. The cavity 1312 provides an ideal sealed environment compatible with the operation of a MEMS device, and may be filled with a dry inert gas, a liquid, or sealed under vacuum depending on the requirements needed for best operation of the MEMS device.

It has been discovered that the multi-chip package system 1300 is highly versatile, enabling the integration of sensing, data handling, computing and other functions depending on the application onto a single package. The multi-chip package system 1300 incorporates pre-tested components classified as good known dies or good known packages, significantly increasing manufacturing yield. It has been discovered that the support protrusion 1304 in the internal stacking module 1302 improves the robustness and reliability of the manufacturing process for the multi-chip package system 1300. Further, the support protrusion 1304 enables a reduction in the overall thickness of the multi-chip package system 1300.

Figure 14:
FIG. 14 is the base package substrate at the initial stages of the fabrication process for the multi-chip package system shown in FIG. 9.

Referring now to FIG. 14, therein is shown the base package substrate 302 at the initial stages of the fabrication process for the multi-chip package system 900 shown in FIG. 9.

Figure 15:
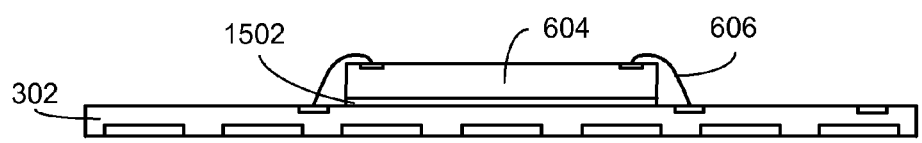
FIG. 15 is the structure of FIG. 14 following the mounting of the device using an adhesive, and connecting the device to the base package substrate using the interconnect.

Referring now to FIG. 15, therein is shown the structure of FIG. 14 following the mounting of the device 604 using an adhesive 1502, and connecting the device 604 to the base package substrate 302 using the interconnect 606.

Figure 16:
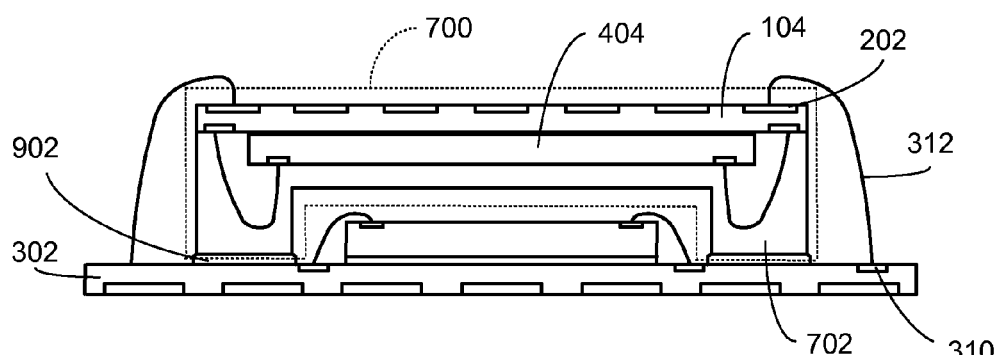
FIG. 16 is the structure of FIG. 15 following the mounting of the internal stacking module over the base package substrate.

Referring now to FIG. 16, therein is shown the structure of FIG. 15 following the mounting of the internal stacking module 700 over the base package substrate 302. The internal stacking module is attached to the base package substrate 302 using the adhesive 902.

Following the attachment of the internal stacking module 700 to the base package substrate 302, the bottom contact pad 202 in the package substrate 104 is connected to the top contact pad 310 in the base package substrate 302 using the interconnect 312. The support protrusion 702 supports the package substrate 104 during wire bonding, preventing down deflection of the package substrate 104 which may induce failure of or a reduction in the reliability of the base semiconductor die 404.

The support protrusion 702 may have different top view shapes and may be arranged in different locations. FIG. 7 and FIGS. 17-20 illustrate examples of potential shapes and locations for the support protrusion 702. The support protrusion 702 is generally placed in regions where wire bonding may cause down-deflection of the package substrate 104 in the internal stacking module 700, or in a configuration that enables flow of a molding compound or other encapsulant during the assembly of the multi-chip package module 900.

Figure 17:
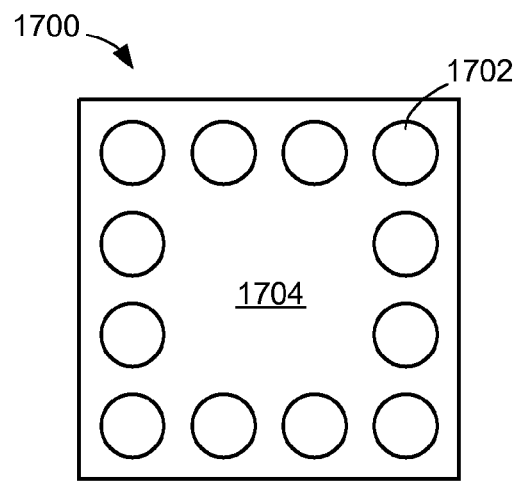
FIG. 17 is a top plan view of an alternate embodiment of a support protrusion in an internal stacking module.

Referring now to FIG. 17, therein is shown a top plan view of an alternate embodiment of a support protrusion 1702 in an internal stacking module 1700. In this embodiment of the invention, the support protrusion 1702 has a circular footprint and is located at the periphery of the internal stacking module 1700. For illustration purposes it is assumed that the top surface of the internal stacking module 1700 is covered by an encapsulation layer 1704, similar to the configuration used for the internal stacking module 700 shown in FIG. 8.

Figure 18:
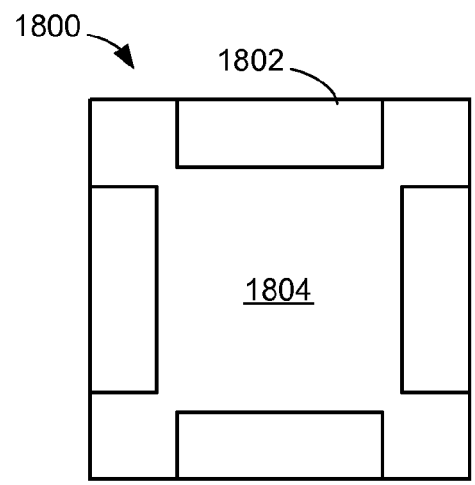
FIG. 18 is a top plan view of an alternate embodiment of a support protrusion in an internal stacking module.

Referring now to FIG. 18, therein is shown a top plan view of an alternate embodiment of a support protrusion 1802 in an internal stacking module 1800. In this embodiment of the invention, the support protrusion 1802 has a rectangular footprint and is located at the periphery of the internal stacking module 1800. For illustration purposes it is assumed that the top surface of the internal stacking module 1800 is covered by an encapsulation layer 1804, similar to the configuration used for the internal stacking module 700 shown in FIG. 8.

Figure 19:
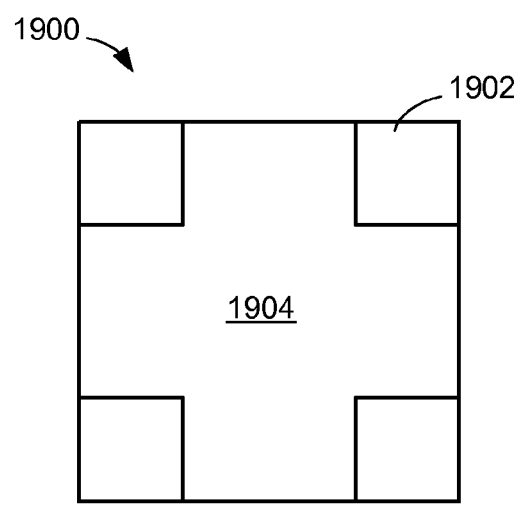
FIG. 19 is a top plan view of an alternate embodiment of a support protrusion in an internal stacking module.

Referring now to FIG. 19, therein is shown a top plan view of an alternate embodiment of a support protrusion 1902 in an internal stacking module 1900. In this embodiment of the invention, the support protrusion 1902 has a square footprint and is located at a corner of the internal stacking module 1900. For illustration purposes it is assumed that the top surface of the internal stacking module 1900 is covered by an encapsulation layer 1904, similar to the configuration used for the internal stacking module 700 shown in FIG. 8.

Figure 20:
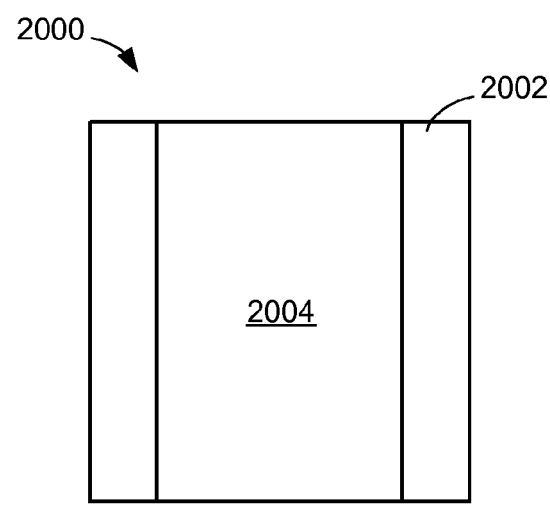
FIG. 20 is a top plan view of an alternate embodiment of a support protrusion in an internal stacking module.

Referring now to FIG. 20, therein is shown a top plan view of an alternate embodiment of a support protrusion 2002 in an internal stacking module 2000. In this embodiment of the invention, the support protrusion 2002 has a rectangular footprint and is located at two opposing sides of the internal stacking module 2000. For illustration purposes it is assumed that the top surface of the internal stacking module 2000 is covered by an encapsulation layer 2004, similar to the configuration used for the internal stacking module 700 shown in FIG. 8.

The support protrusion patterns shown in FIGS. 13-16 illustrate the wide variety of support protrusion plan view shapes and locations that may be employed in the implementation of the internal stacking modules.

Figure 21:
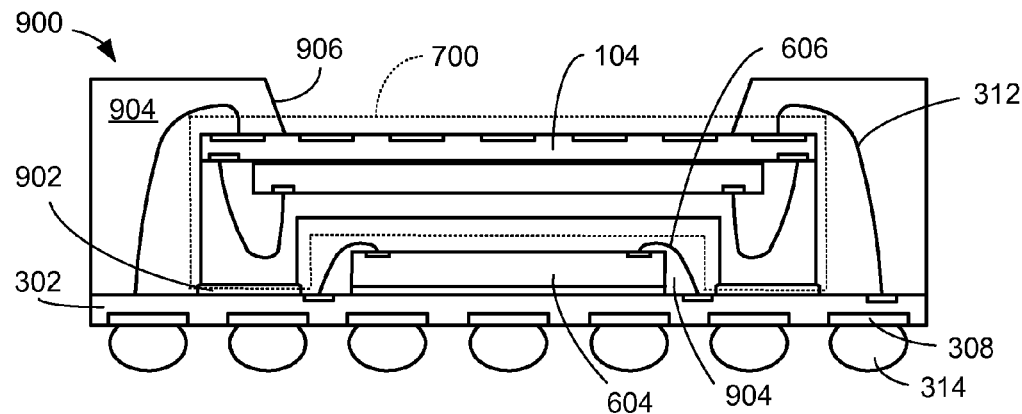
FIG. 21 is the structure of FIG. 16 following encapsulation, completing the fabrication of the multi-chip package system.

Referring now to FIG. 21, therein is shown the structure of FIG. 16 following encapsulation, completing the fabrication of the multi-chip package system 900. The encapsulant 904, such as a molding compound, is applied over at least portions of the internal stacking module 700, the base package substrate 302, and the interconnect 312. The external interconnect 314 is provided for establishing electrical connections to the next system level.

Figure 22:
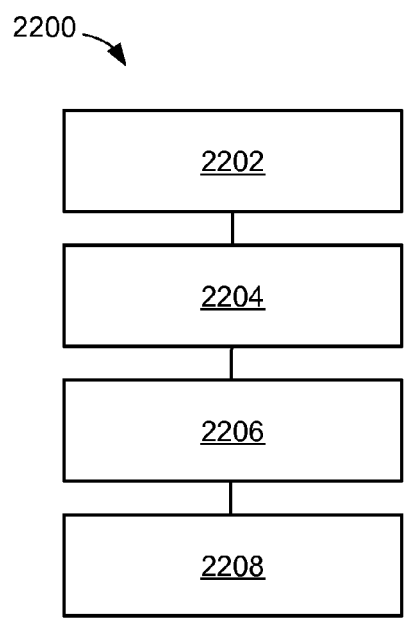
FIG. 22 is a flow chart of a multi-chip package system for manufacturing the multi-chip package system of FIG. 9 in an embodiment of the present invention.

Referring now to FIG. 22, therein is shown a flow chart of a method 2200 for manufacturing a multi-chip package system 900 in an embodiment of the present invention. The method 2200 includes providing a base package substrate in a block 2202; attaching a base semiconductor die to the package substrate in a block 2204; connecting an interconnect between the base semiconductor die and the package substrate in a block 2206; and encapsulating at least portions of the package substrate, the base semiconductor die, and the interconnect with an encapsulant defining a support protrusion adjacent to the interconnect and substantially perpendicular to the package substrate, a cavity bounded by the support protrusion, and a gap linking the cavity to the edge of the encapsulant in a block 2208.

The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing a multi-chip package system comprising:
   providing a package substrate;
   attaching a base semiconductor die to the package substrate;
   connecting an interconnect between the base semiconductor die and the package substrate; and
   encapsulating at least portions of the package substrate, the base semiconductor die, and the interconnect with an encapsulant defining a support protrusion adjacent to the interconnect and substantially perpendicular to the package substrate, a cavity bounded by the support protrusion, and a gap linking the cavity to the edge of the encapsulant.

2. The method as claimed in claim 1 further comprising filling the cavity with an encapsulant or a penetrable adhesive material.

3. The method as claimed in claim 1 wherein encapsulating at least portions of the package substrate, the base semiconductor die, and the interconnect with an encapsulant defines a support protrusion with a circular or rectangular footprint placed at the corner or at the edge of the multi-chip package system adjacent to the interconnect and substantially perpendicular to the package substrate.

4. The method as claimed in claim 1 further comprising mounting a flip-chip semiconductor die over a portion of the base semiconductor die within the cavity.

5. The method as claimed in claim 1 wherein:
   encapsulating at least portions of the package substrate, the base semiconductor die, and the interconnect with the encapsulant defining a support protrusion adjacent to the interconnect and substantially perpendicular to the package substrate, and a cavity bounded by the support protrusion; and
   further comprising:
   filling the cavity with a penetrable adhesive material; and
   attaching the support protrusion to a base package substrate using an excess of the penetrable adhesive material, defining a separation gap between the support protrusion and the base package substrate.

6. A method of manufacturing a multi-chip package system comprising:
   providing a package substrate;
   attaching a base semiconductor die to the package substrate;
   connecting an interconnect between the base semiconductor die and the package substrate;
   encapsulating at least portions of the package substrate, the base semiconductor die, and the interconnect with an encapsulant defining a support protrusion adjacent to the interconnect and substantially perpendicular to the package substrate, a cavity bounded by the support protrusion, and a gap linking the cavity to the edge of the encapsulant;
   attaching a base package substrate to the support protrusion;
   connecting an interconnect between the base package substrate and the package substrate; and
   encapsulating at least portions of the package substrate, the support protrusion, the cavity, the base package substrate, and the interconnect using an encapsulant.

7. The method as claimed in claim 6 further comprising attaching a device to a portion of the base package substrate within the cavity.

8. The method as claimed in claim 6 wherein encapsulating at least portions of the package substrate, the base semiconductor die, and the interconnect with the encapsulant results in the definition of a support protrusion with a circular or a rectangular footprint placed at the corner or at the edge of the multi-chip package system.

9. The method as claimed in claim 6 further comprising attaching a top flip-chip semiconductor die on the exposed portions of package substrate.

10. The method as claimed in claim 6 further comprising attaching: a below-substrate semiconductor die on the exposed region of the base package substrate following the application of the encapsulant.

11. A multi-chip package system comprising:
    a package substrate;
    a base semiconductor die attached to the package substrate;
    an interconnect connecting the base semiconductor die to the package substrate;
    a support protrusion adjacent to the interconnect and substantially perpendicular to the package substrate;
    a cavity bounded by the support protrusion; and
    a gap linking the cavity to the edge of the package substrate.

12. The system as claimed in claim 11 further comprising an encapsulant or a penetrable adhesive material filling the cavity.

13. The system as claimed in claim 11 wherein the support protrusion has a circular or rectangular footprint and is placed at the corner or at the edge of the multi-chip package system.

14. The system as claimed in claim 11 further comprising a flip-chip semiconductor die mounted over a portion of the base semiconductor die within the cavity.

15. The system as claimed in claim 11 further comprising:
    a penetrable adhesive material filling the cavity;
    a base package substrate mounted against the protrusion support; and
    a separation gap between the support protrusion and the base package substrate defined by an excess of the penetrable adhesive material.

16. The system as claimed in claim 11 further comprising:
    a base package substrate attached to the support protrusion;
    an interconnect connecting the base package substrate to the package substrate; and
    an encapsulant encapsulating at least portions of the package substrate, the support protrusion, the cavity, the base package substrate, and the interconnect.

17. The system as claimed in claim 16 further comprising a device attached to a portion of the base package substrate within the cavity.

18. The system as claimed in claim 16 wherein the support protrusion has a circular or a rectangular footprint and is located at the corner or at the edge of the multi-chip package system.

19. The system as claimed in claim 16 further comprising a top flip-chip semiconductor die attached to the exposed portions of the package substrate.

20. The system as claimed in claim 16 further comprising a below-substrate semiconductor die attached to the exposed region of the base package substrate.

* * * * *